United States Patent

[11] 3,613,035

[72] Inventor Robert Emerson Askew
Berkeley Heights, N.J.
[21] Appl. No. 876,380
[22] Filed Nov. 13, 1969
[45] Patented Oct. 12, 1971
[73] Assignee RCA Corporation

[54] TUNING ARRANGEMENT FOR A STRIP TRANSMISSION LINE IN A HERMETICALLY SEALED PACKAGE
6 Claims, 1 Drawing Fig.

[52] U.S. Cl. .................................. 333/84 M, 333/735, 333/97
[51] Int. Cl. .................................. H01p 1/00, H01p 3/08
[50] Field of Search .................................. 333/84 M, 82, 73 S, 84, 73; 174/52.6, 65.2

[56] References Cited

UNITED STATES PATENTS

| | | | |
|---|---|---|---|
| 2,259,690 | 10/1941 | Hansen et al. | 333/98 P |
| 2,338,306 | 1/1944 | Smyth | 333/98 P |
| 2,951,149 | 8/1960 | Grieg et al. | 333/84 M |
| 3,359,513 | 12/1967 | Kelley | 333/84 |
| 3,421,122 | 1/1969 | Ito et al. | 333/84 M |
| 3,471,812 | 10/1969 | Lackner | 333/84 M |

*Primary Examiner*—Eli Lieberman
*Assistant Examiner*—William H. Punter
*Attorney*—Edward J. Norton

ABSTRACT: A tuning arrangement for a hermetically sealed strip transmission line is provided. A portion of the ground plane of the strip transmission line is removed leaving a portion of the dielectric substrate exposed. An enclosure surrounds the entire transmission line except for the area thereof where the ground plane is removed and the dielectric is exposed. A tuning stub is supported with respect to the removed area of the ground plane so as to enable tuning of the transmission line by the stub. Since the dielectric substrate remains between the inner area of the enclosure and the outside atmosphere, a seal can be maintained between the inner area of the enclosure and the outside atmosphere.

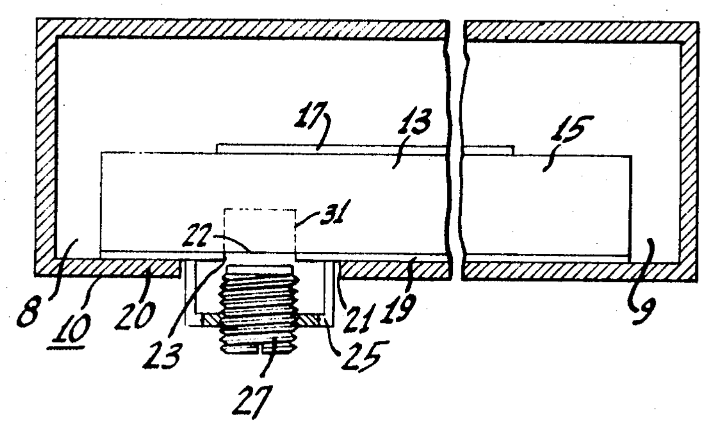
INVENTOR.
ROBERT EMERSON ASKEW
BY Robert L. Troike
Attorney

TUNING ARRANGEMENT FOR A STRIP TRANSMISSION LINE IN A HERMETICALLY SEALED PACKAGE

This invention relates to a tuning arrangement for an enclosed strip transmission line.

As in other areas of electronics, there is a need in the microwave industry for low-cost and compact devices. Strip transmission lines provide the low-cost and compact construction desired. The term "strip transmission line" as used herein refers to that form of transmission line wherein at least one sheet or substrate of dielectric material is used with one ground planar conductor on one surface of the substrate and a narrow striplike conductor on the opposite surface of the substrate. One particular form of strip-transmission line referred to as "microstrip" is formed by a single, flat sheet of dielectric material with a narrow striplike conductor on one of the broad surfaces of the substrate and a broad conductor on the opposite surface of the substrate. In the production of a microwave circuit using the microstrip transmission line configuration, one side of the dielectric sheet is almost entirely covered with the conductive layer and the opposite surface has one or more narrow conductive strips arranged to provide the desired circuitry. Active devices such as a transistor pellet may be mounted on the substrate and appropriately connected to the conductive strips to form a desired microwave, active circuit device.

For long life and reliable performance in a humid environment, for example, a circuit which contains a transistor pellet or other active device should be placed in a hermetically sealed package. Often it is required that the circuit be tuned after the circuit is sealed in the package. This requires an opening in the package for a tuning screw or other tuning means. In the prior art, expensive and complicated sealing techniques are used to prevent leakage around the tuning means, allowing the tuning means to be adjustable and yet allowing the package to retain its hermeticity.

It is an object of the present invention to provide a low-cost variable tuning arrangement for an enclosed strip transmission line which maintains hermeticity.

A strip transmission line circuit assembly is positioned within a sealable package or enclosure with the ground plane of the transmission line circuit secured to a wall of the enclosure. A portion of the wall and of the ground plane is removed, making a corresponding area of the dielectric substrate included in the transmission line circuit accessible from outside the enclosure. A tuning stub is positioned relative to the exposed area of the substrate to enable tuning of the transmission line circuit assembly from outside the enclosure, the substrate serving to maintain the seal between the inner area of the enclosure and the outside thereof.

The above and still other objects, advantages and features will become apparent upon consideration of the following detailed description when taken in conjunction with the single FIGURE of the accompanying drawing which is a partly cross sectional view of one embodiment of the present invention.

Referring now to the accompanying illustration, portions 8 and 9 of a single, sealed package or enclosure 10 are shown in cross section. The entire package 10 would include both portions 8 and 9 with the walls joined together to enclose a transmission line circuit 13 and provide a sealed structure. The break between portions 8 and 9 is provided to indicate that any additional circuitry or desired structure may be placed therebetween within the package 10.

The transmission line circuit 13 is formed by a substantially flat dielectric substrate 15 with at least one narrow striplike conductor 17 on one of the flat surfaces of the substrate 15 and a flat and substantially wider planar conductor 19 serving as a ground conductor on the opposite surface of the substrate 15. Signals are applied by suitable fixed means, not shown, between the narrow striplike conductor 17 and the wider ground planar conductor 19 and these signals propagate as electromagnetic waves predominately in the TEM mode along the transmission line 13. The walls of the package 10, which can be of a suitable metallic conductive material or in some applications of an insulative, nonmetallic material, enclose the transmission line circuit 13 such that the ground planar conductor 19 is adjacent to one wall 20 as shown in the accompanying illustration.

The walls of the package 10 completely surround the transmission line circuit 13 except for an aperture 21 located in the wall 20 adjacent the ground planar conductor 19. At the region of this aperture 21, the ground planar conductor 19 has an aperture 23 therein, exposing a portion 22 of the dielectric substrate 15. The apertures 21 and 23 are arranged so as to be aligned as shown in the accompanying illustration. A threaded support 25 is mounted as shown and on to the ground planar conductor 19. A threaded metallic tuning screw 27 (brass, steel, etc.) is located within the support 25 and is oriented by the support 25 so that by turning the tuning screw 27, one end of the tuning screw moves closer to or away from the exposed portion 22 of the dielectric substrate 15 as permitted by the aperture 23 in the ground conductor 19. A cavity 31 in the dielectric substrate 15 in the area of the exposed portion 22 may be provided. This cavity 31 will allow the tuning screw 27 to enter the substrate 15 and consequently will increase the tuning range. Care must be taken however to make sure that this cavity 31 does not extend all the way through the dielectric substrate 15 and thus cause loss of the hermetic seal provided by the substrate 15.

A hermetic seal is maintained in this structure by the dielectric substrate 15 completely covering the apertures 21 and 23. The dielectric substrate 15 is, in turn, fixedly sealed to ground conductor 19 and the ground conductor 19 is fixedly sealed to the wall 20 of the package to provide a totally sealed package. Tunability is provided in the arrangement because the aperture 23 in the ground plane allows the screw 27 to change the electromagnetic field pattern between the narrow conductor 17 and ground plane 19.

In the first step toward producing the tuning arrangement described above, a flat dielectric substrate 15 is provided with a ground planar conductor 19 on one flat surface. A small section (aperture 23) of the ground conductor 19 is next removed without putting a hole through the dielectric substrate 15. The narrow conductive strips 17 would then be placed on the opposite surface of the substrate 15 with a portion of the narrow strip at which tuning is desired being opposite the aperture 23. The entire microstrip circuit is then placed in a conductive package having an aperture in one wall such that the aperture in the ground conductor 19 is aligned with that in the wall of the package. The ground planar conductor is then fixed to the apertured wall of the package by soldering or other suitable means. A tuning mechanism made up of the tuning screw 27 and threaded support 25 is then soldered or otherwise fixed in place over the aperture 23.

While not shown in the drawing, it is understood that any desired fixed connections can be provided through the walls of the package to the circuit arrangement therein to provide suitable electrical inputs and outputs for the circuit. Also, while not shown in the drawing, it is understood that suitable valving for creating a sealed or other controlled environment within the package 10 can be provided as known in the art.

What is claimed is:

1. In combination, a transmission line circuit arrangement of the type including a dielectric substrate with a broad conductor on one surface of said substrate and at least one narrow striplike conductor on the opposite surface of said substrate, an enclosure surrounding said circuit arrangement and having a wall in fixed contact with said broad conductor, there being an opening through said wall and said broad conductor exposing an area of said dielectric substrate with said substrate isolating the inner area of said enclosure from the outside thereof, and means positioned at said opening which is adjustable relative to said opening for tuning said circuit arrangement.

2. In a strip transmission line circuit assembly of the type where a strip transmission line is positioned within a sealable enclosure, said line being formed of a dielectric substrate having a broad conductor on one surface of said substrate and at least one narrow striplike conductor on the opposite surface of said substrate, the broad conductor being fixed to a wall of said enclosure, the improvement whereby an adjustable tuning means is provided for said assembly comprising the wall and the broad conductor having an opening therethrough to expose an area of said substrate opposite said narrow conductor, the substrate maintaining isolation between the inner area of said enclosure and the outside thereof, and means positioned at said opening which is adjustable relative to said exposed area of said substrate for tuning said assembly.

3. In a strip transmission line assembly as claimed in claim 2, said tuning means comprising a tuning stub mounted in a support so as to be adjustable relative to said exposed area of said substrate.

4. In a strip transmission line assembly as claimed in claim 3, said stub being metallic and threaded for movement within said support toward and away from said substrate.

5. In a strip transmission line assembly as claimed in claim 4, said substrate having a cavity therein but not therethrough aligned with said stub to permit passage of said stub in and out of said cavity.

6. In a strip transmission line assembly as claimed in claim 3, said support being mounted to said broad conductor.